(12) United States Patent
Watanabe

(10) Patent No.: US 8,227,852 B2
(45) Date of Patent: Jul. 24, 2012

(54) NONVOLATILE SEMICONDUCTOR MEMORY

(75) Inventor: Hiroshi Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1003 days.

(21) Appl. No.: 11/839,156

(22) Filed: Aug. 15, 2007

(65) Prior Publication Data

US 2008/0042188 A1 Feb. 21, 2008

(30) Foreign Application Priority Data

Aug. 16, 2006 (JP) ................................. 2006-222001

(51) Int. Cl.
*H01L 29/788* (2006.01)
(52) U.S. Cl. ................. 257/316; 257/317; 257/E21.209
(58) Field of Classification Search .................. 257/315, 257/316, 317, E21.209
See application file for complete search history.

(56) References Cited

U.S. PATENT DOCUMENTS

| 6,660,588 B1* | 12/2003 | Yang et al. ..................... 438/257 |
| 2002/0079548 A1* | 6/2002 | Hu ................................ 257/412 |
| 2004/0119110 A1* | 6/2004 | Park .............................. 257/315 |
| 2004/0264236 A1* | 12/2004 | Chae et al. ..................... 365/154 |
| 2005/0023063 A1 | 2/2005 | Mueller |
| 2005/0212036 A1* | 9/2005 | Tanaka et al. .................. 257/316 |
| 2007/0132003 A1 | 6/2007 | Takashima et al. |

FOREIGN PATENT DOCUMENTS

| JP | 2005-197363 | 7/2005 |
| KR | 10-2001-0061110 | 7/2001 |
| KR | 10-2006-0052126 | 5/2006 |
| KR | 10-2006-0078070 | 7/2006 |

OTHER PUBLICATIONS

Hiroshi Watanabe, "Depletion Layer of Gate Poly-Si," IEEE Transactions on Electron Devices, vol. 52, No. 10, Oct. 2005, pp. 2265-2271.

Hiroshi Watanabe, et al., "Reduction of Accumulation Thickness in Metal Gate," Extended Abstracts of the 2005 International Conference on Solid State Devices and Materials, Kobe, Sep. 13, 2005, pp. 504-505.

Office Action issued Aug. 24, 2009 in Korean Application No. 10-2007-81791 (w/English translation).

* cited by examiner

*Primary Examiner* — Zandra Smith
*Assistant Examiner* — Jamie C Niesz
(74) *Attorney, Agent, or Firm* — Oblon, Spivak, McClelland, Maier & Neustadt, L.L.P.

(57) ABSTRACT

A nonvolatile semiconductor memory includes a memory cell including, a semiconductor substrate, a first insulating layer on the semiconductor substrate, a floating gate on the first insulating layer, a second insulating layer on the floating gate, and a control gate electrode on the second insulating layer, wherein the floating gate is comprised a first conductive layer which is contact with the first insulating layer, a second conductive layer which is contact with the second insulating layer, and a semiconductor layer between the first and second conductive layers, and each of the first and second conductive layer is a metal layer or a silicide layer.

15 Claims, 14 Drawing Sheets

*1 Adjusting by means of capacitive coupling ratio

*1 Band is bent from assumption of depletion approximation

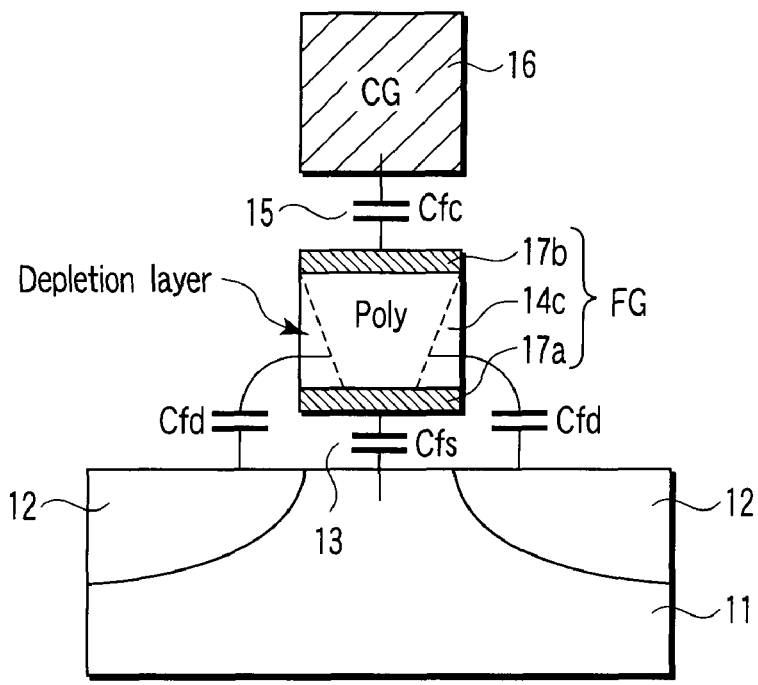
F I G. 10
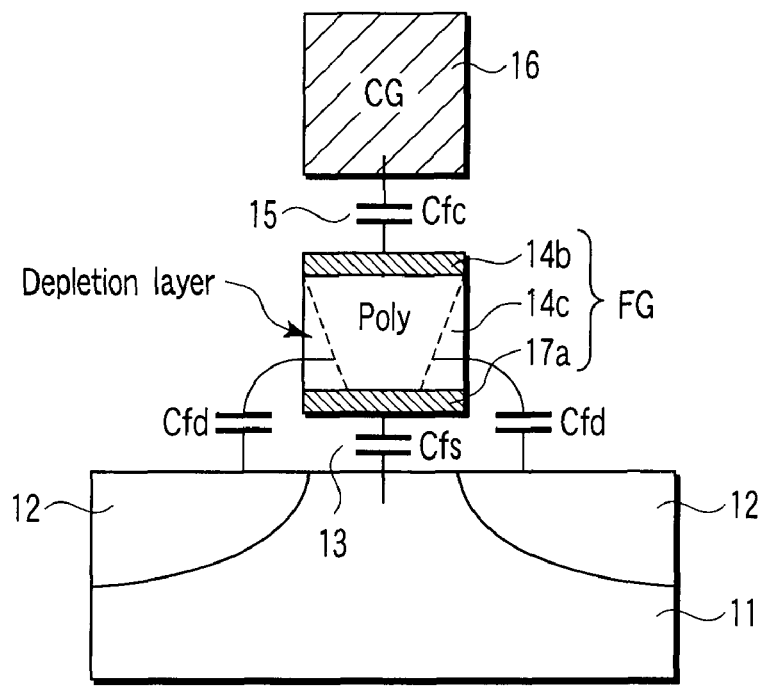
F I G. 12

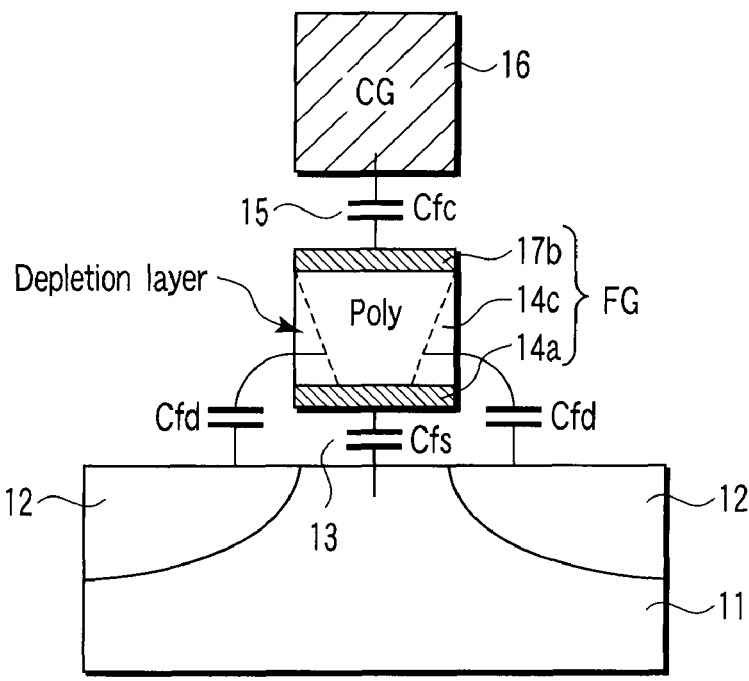
F I G. 14
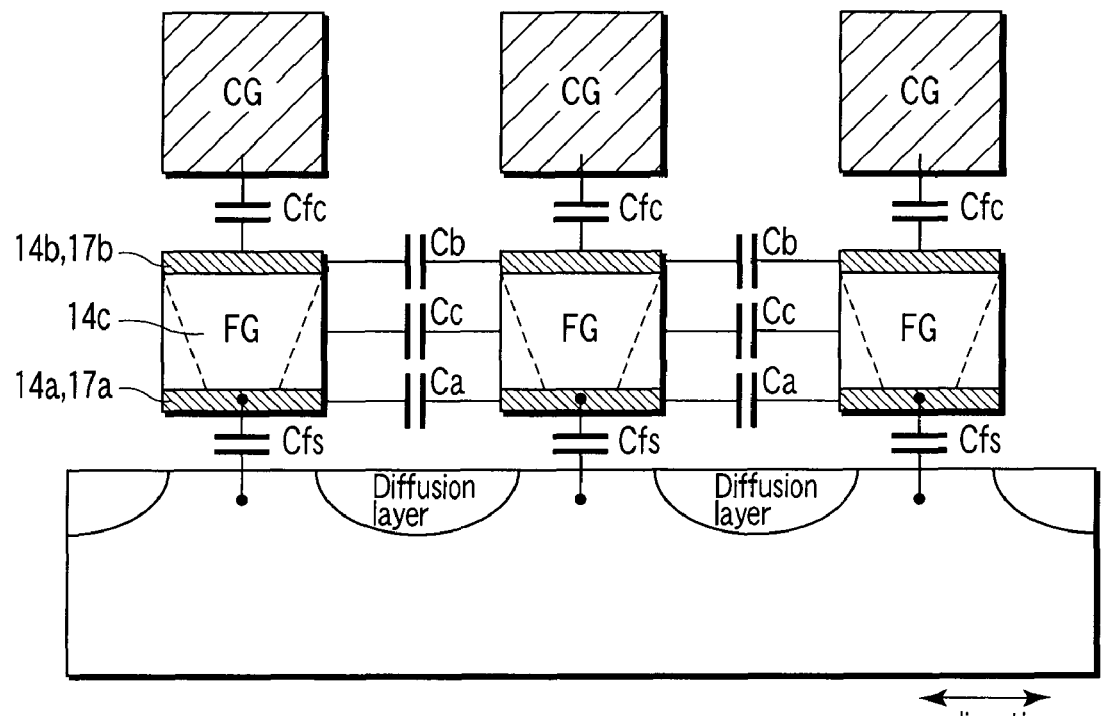
F I G. 16

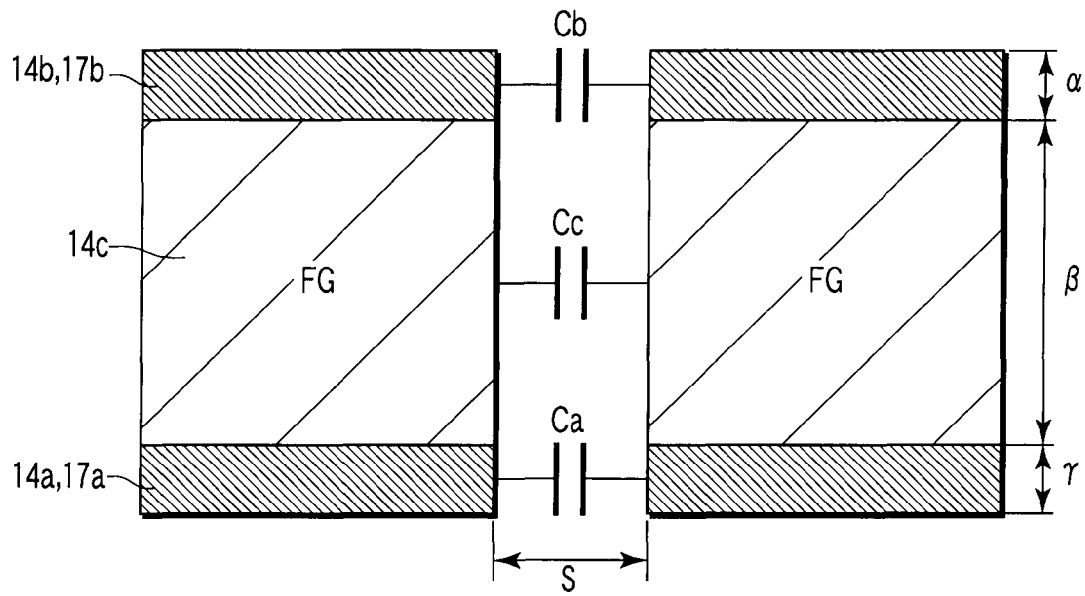
F I G. 17
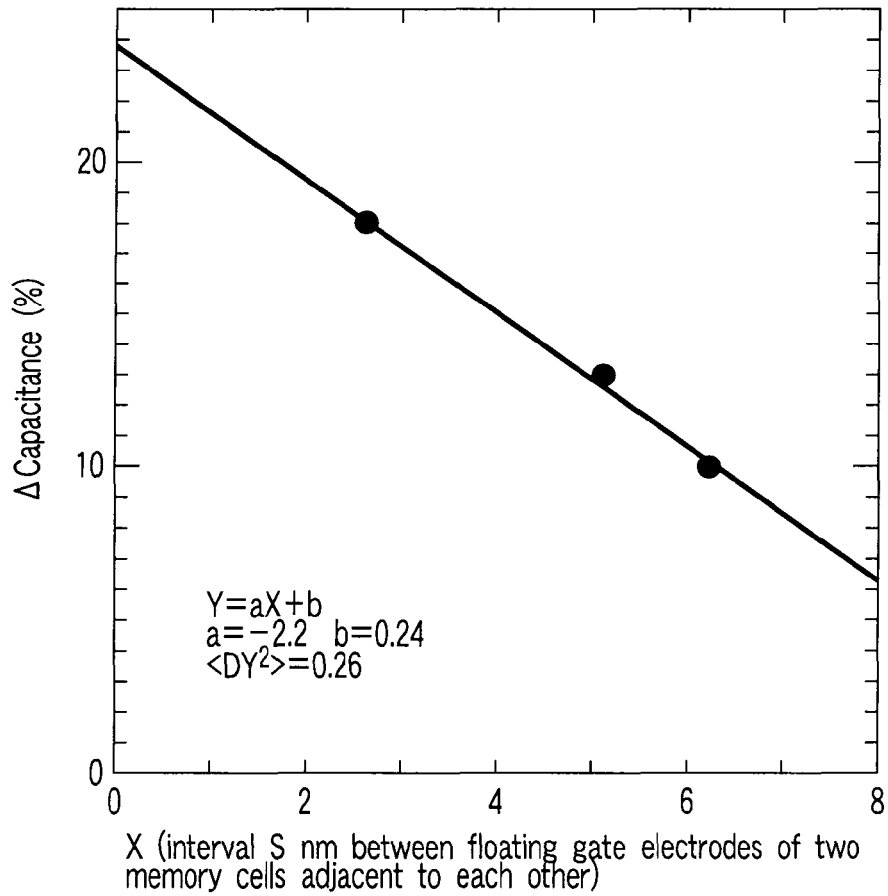
F I G. 18

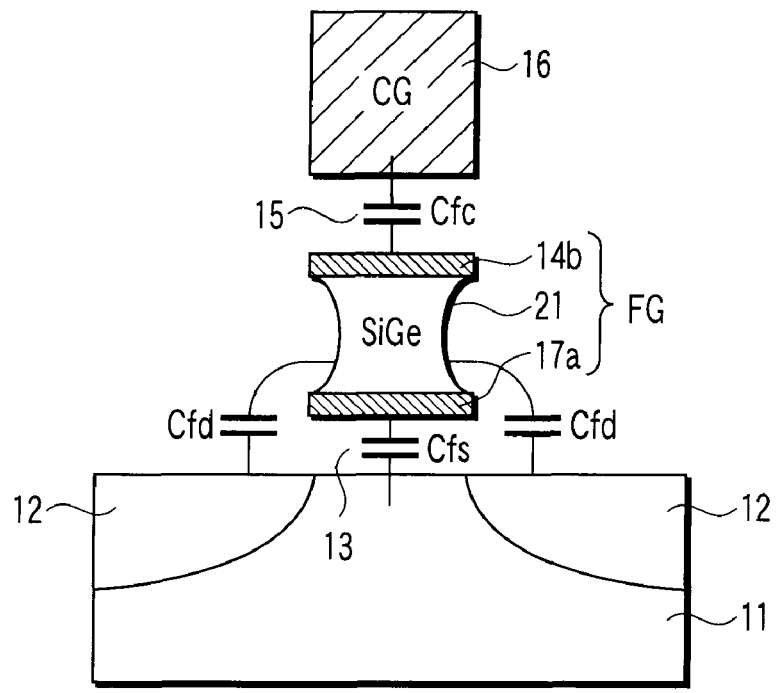
F I G. 21
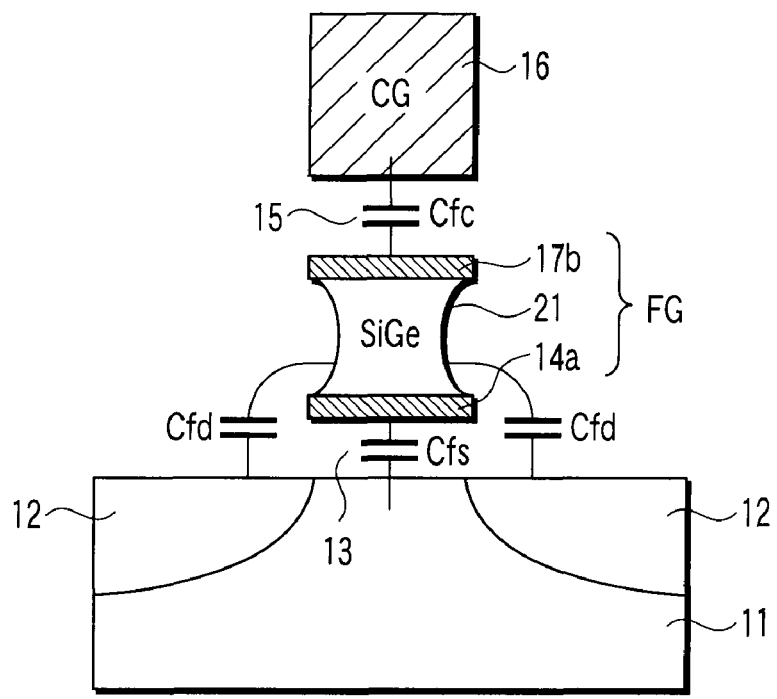
F I G. 22

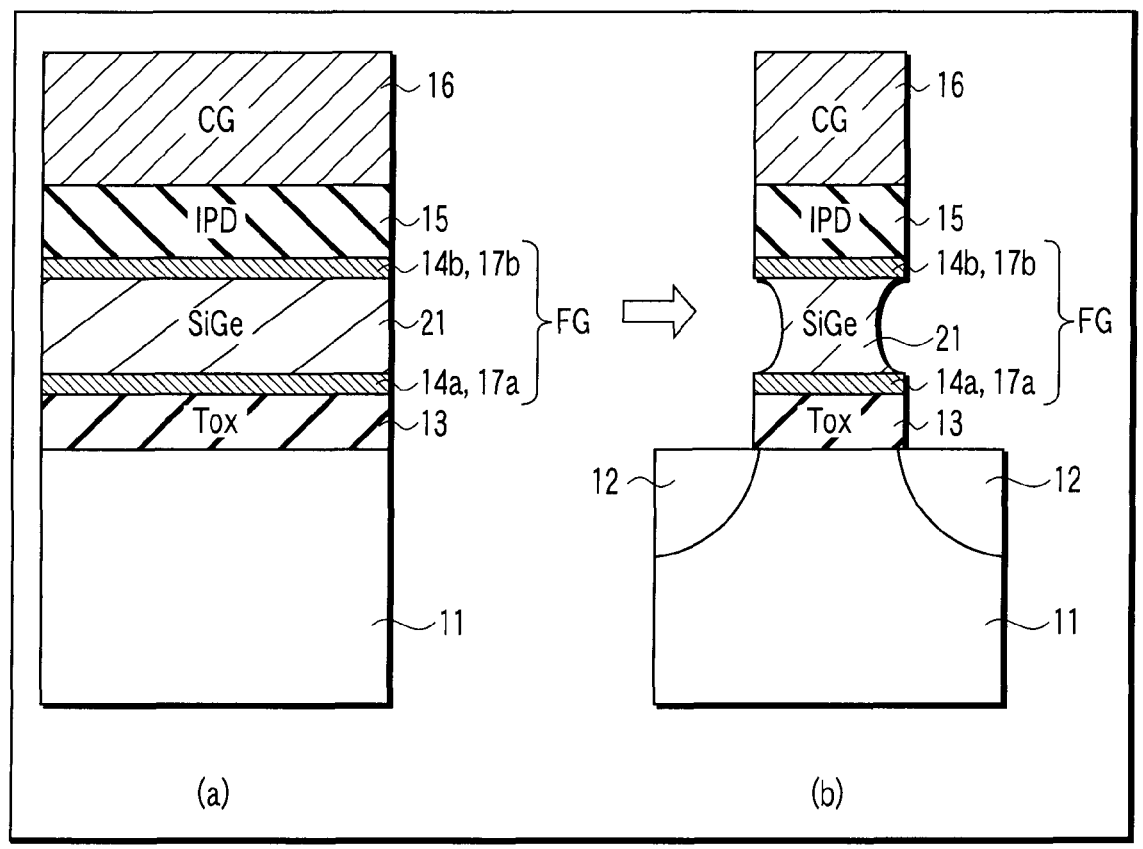
F I G. 23

NONVOLATILE SEMICONDUCTOR MEMORY

CROSS-REFERENCE TO RELATED APPLICATIONS

This application is based upon and claims the benefit of priority from prior Japanese Patent Application No. 2006-222001, filed Aug. 16, 2006, the entire contents of which are incorporated herein by reference.

BACKGROUND OF THE INVENTION

1. Field of the Invention

The present invention relates to a gate electrode structure of a memory cell of a nonvolatile semiconductor memory.

2. Description of the Related Art

A memory cell of a nonvolatile semiconductor memory such as a NAND-type flash memory has a stack gate structure comprised a floating gate and a control gate electrode. Data-program/erase is performed in such a manner that a threshold of the memory cell is caused to change by moving electric charges between a silicon substrate and the floating gate while utilizing Fowler-Nordheim (FN) tunneling.

Here, in order to cause the nonvolatile semiconductor memory to function as a nonvolatile semiconductor memory, a high threshold and a low threshold should be distinguished accurately while making variation width (margin) of the threshold of the memory cell larger than a fixed width.

However, in recent years, in order to lower price per bit, miniaturization of the memory cell has been promoted noticeably. When the memory cell is miniaturized, variation width of the threshold becomes small because of interference between adjacent memory cells. In order to solve this problem, a technique for accurately controlling the variation width of the threshold becomes necessary.

However, control of the variation width of the threshold becomes difficult by a leak produced at an insulating layer between a floating gate and a control gate electrode. This leak is generally called an inter-polysilicon dielectric (IPD) leak because its insulating layer is called the inter-polysilicon dielectric.

The IPD leak becomes particularly noticeable at the time of programming, that is, when electrons are injected into the floating gate from the silicon substrate. Specifically, the threshold of the memory cell is hard to be controlled because, even though electrons are injected into the floating gate from the silicon substrate, at the same time, electrons are emitted from the floating gate to the control gate electrode by the IPD leak.

BRIEF SUMMARY OF THE INVENTION

A nonvolatile semiconductor memory according to an aspect of the present invention comprises a memory cell comprising, a semiconductor substrate, a first insulating layer on the semiconductor substrate, a floating gate on the first insulating layer, a second insulating layer on the floating gate, and a control gate electrode on the second insulating layer, wherein the floating gate is comprised a first conductive layer which is contact with the first insulating layer, a second conductive layer which is contact with the second insulating layer, and a semiconductor layer between the first and second conductive layers, and each of the first and second conductive layer is a metal layer or a silicide layer.

A nonvolatile semiconductor memory according to an aspect of the present invention comprises a memory cell comprising, a semiconductor substrate, a first insulating layer on the semiconductor substrate, a floating gate on the first insulating layer, a second insulating layer on the floating gate, and a control gate electrode on the second insulating layer, wherein the floating gate is comprised a first conductive layer which is contact with the first insulating layer, a second conductive layer which is contact with the second insulating layer, and a semiconductor layer having a shape in which a center part is constricted and arranged between the first and second conductive layers, and each of the first and second conductive layer is metal layer or silicide layer.

BRIEF DESCRIPTION OF THE SEVERAL VIEWS OF THE DRAWING

FIG. 10 is a view showing a gate electrode structure of a memory cell of a second embodiment;

FIG. 12 is a view showing a gate electrode structure of a memory cell of a third embodiment;

FIG. 14 is a view showing a gate electrode structure of a memory cell of a fourth embodiment;

FIG. 16 is a view showing capacitance-between-cells of a memory cell of a fifth embodiment;

FIG. 17 is a view showing parameters related to a relational expression of the fifth embodiment;

FIG. 18 is a view showing difference in a capacitance-between-cells between the metal gate and the polysilicon gate;

FIG. 21 is a view showing the gate electrode structure of the sixth embodiment;

FIG. 22 is a view showing the gate electrode structure of the sixth embodiment; and FIG. 23 is a view showing a method of manufacturing the gate electrode structure of FIGS. 19 to 22.

DETAILED DESCRIPTION OF THE INVENTION

A nonvolatile semiconductor memory of an aspect of the present invention will be described below in detail with reference to the accompanying drawings.

1. Outline

In a gate electrode structure of a memory cell according to an example of the present invention, a floating gate has a three-layer structure. A first layer is a first conductive layer coming into contact with a gate insulating layer (tunnel insulating layer), a next layer is a second conductive layer coming into contact with the IPD, and a last layer is a semiconductor layer between the first and second conductive layers.

The first and second conductive layers are metal layers or silicide layers, and the semiconductor layer is a polysilicon layer or a compound semiconductor layer such as a silicon germanium.

According to such a gate electrode structure, there is not produced the incomplete depletion layer or the weak accumulation layer in the floating gate due to the fact that the first and second conductive layers exist. Further, since the semiconductor layer exists between the first and second conductive layers, the depletion layer is produced on a side surface of the floating gate, so that a capacitive coupling (FG fringe coupling) produced between the side surface of the floating gate and a diffusion layer becomes weak.

Therefore, a capacitive coupling ratio of the memory cell is improved, and a write efficiency due to decrease of the IPD leak is improved. Further, it is possible to contribute to miniaturization of the memory cell because variation width of the threshold of the memory cell can be controlled accurately.

2. Write Efficiency

The IPD leak largely influences the write efficiency.

As the gate electrode structure for suppressing the IPD leak, investigated are a structure (JP-A 2005-133624) sandwiching the IPD with metal, and a structure (JP-A 2005-300432) arranging metal between the IPD made of a high dielectric material and the floating gate.

However, since both these structures do not take into consideration the capacitive coupling (FG fringe coupling) produced between the side surface of the floating gate and the diffusion layer, it is not possible to cope with the miniaturization of the memory cell.

There will be described with respect to this.

Figure 1:
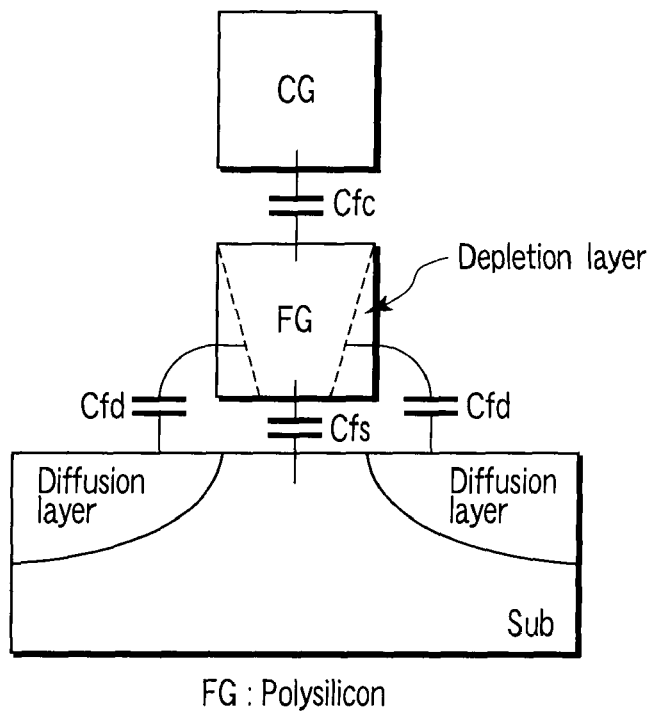
FIG. 1 is a view showing a memory cell having a floating gate with a polysilicon structure.
Figure 2:
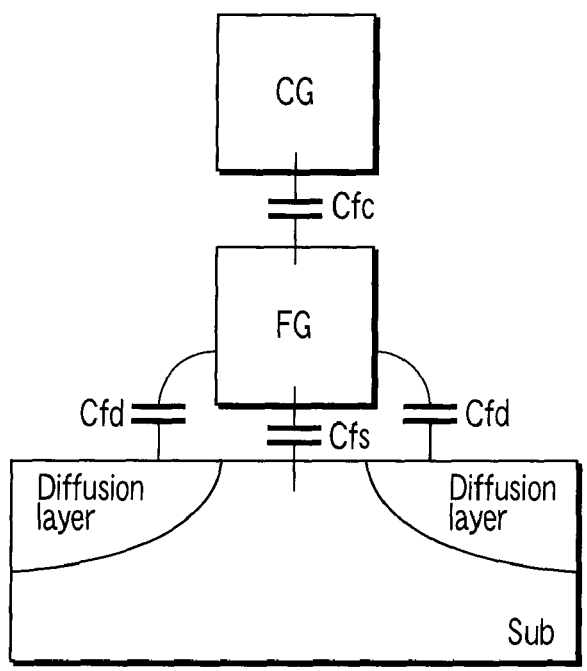
FIG. 2 is a view showing a memory cell having a floating gate with a metal structure.

FIGS. 1 and 2 show a capacitance parasitic on the floating gate.

FIG. 1 is a case in which the floating gate is comprised the polysilicon layer, while FIG. 2 is a case in which the floating gate is comprised the metal layer.

A capacitance Cfd caused by the FG fringe coupling is one of capacitances produced between a floating gate FG and a semiconductor substrate Sub. For this reason, when a capacitance Cfs between the floating gate FG and a channel and a capacitance Cfc between the floating gate FG and the control gate electrode CG become small due to miniaturization, the capacitance Cfd relatively becomes large, so that the capacitive coupling ratio of the memory cell becomes small, where the capacitive coupling ratio is defined by Cfc/(Cfc+Cfs+2Cfd).

At this time, since an electric field applied to the tunnel insulating layer becomes small, and as a result, the write efficiency lowers due to the weakened electric field.

Figure 3:
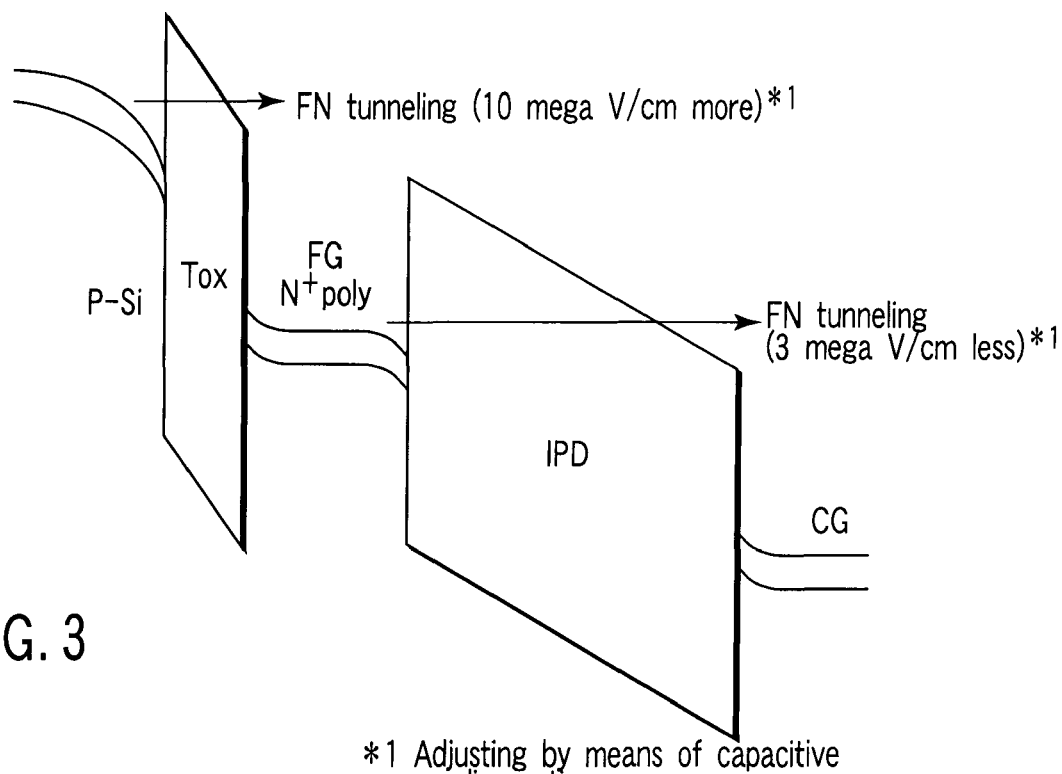
FIG. 3 is a view showing a mechanism of an IPD leak.

FIG. 3 shows this state. Generally, it is necessary that, in order to perform write normally, the electric field of 10 mega V/cm or more is applied to the tunnel insulating layer, and at the same time, the electric field applied to the IPD is suppressed to 3 mega V/cm or less. However, when the capacitive coupling ratio of the memory cell becomes small, the electric field applied to the timely insulating layer is weakened, while that applied to the IPD becomes stronger.

Further, the capacitance between the floating gate and the channel is in proportion to an area where the channel and the floating gate face via the timely insulating layer. However, this area decreases in proportion to square of a gate length, together with miniaturization of the memory cell. On the other hand, the capacitance Cfd does not become small even though the memory cell is miniaturized. For this reason, in post-55 nm generation, it is impossible to disregard influence which the FG fringe coupling inflicts to the capacitive coupling ratio.

Accordingly, in order to realize miniaturization of the memory cell, it becomes indispensable that the capacitance Cfd due to the FG fringe coupling be made small.

The write efficiency deteriorates by the following factors in addition to the capacitance Cfd.

Firstly, as shown in FIG. 1, in the case where the floating gate is comprised the polysilicon layer, at the time of write, the write efficiency deteriorates by the depletion layer produced at an interface between the floating gate and the tunnel insulating layer.

Figure 4:
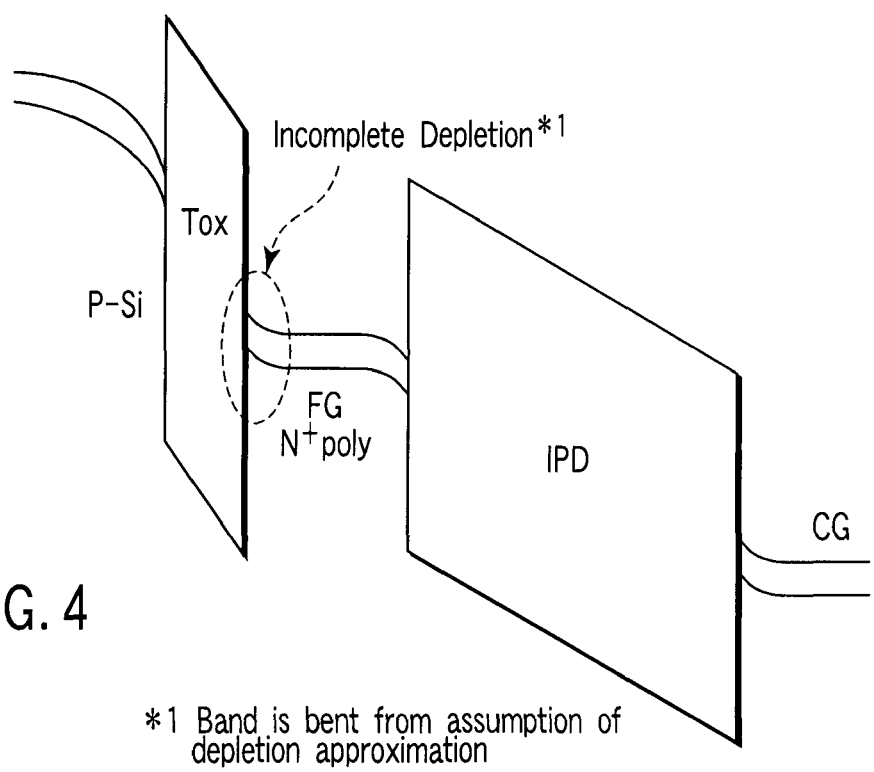
FIG. 4 is a view showing a mechanism of generation of an incomplete depletion layer.
Figure 5:
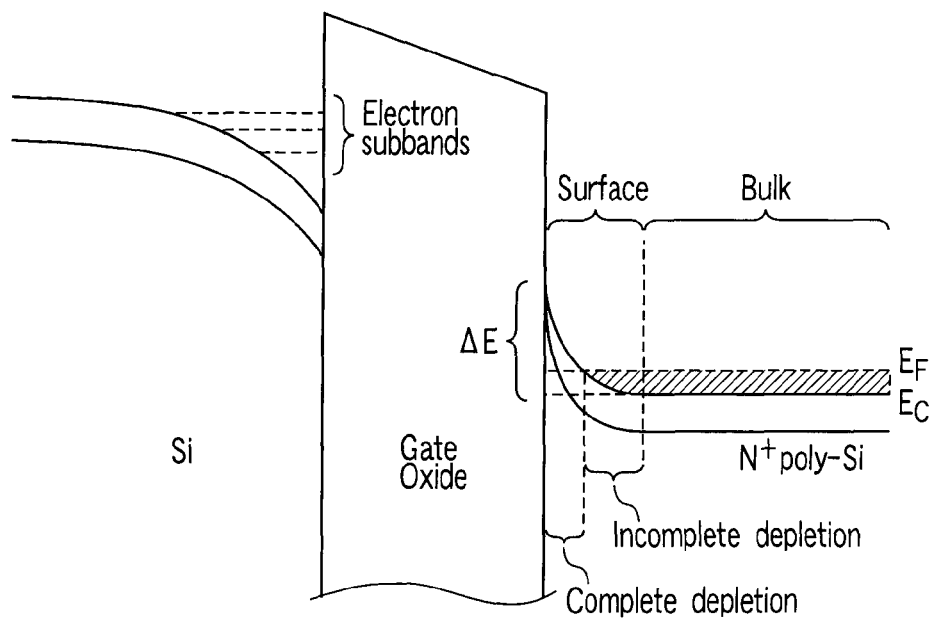
FIG. 5 is a view showing a mechanism of generation of an incomplete depletion layer.

FIGS. 4 and 5 describe its principle.

Since the polysilicon is doped in high concentration and Fermi level is in a conduction band, a region in which electrons are not lost completely, that is, an incomplete depletion layer is produced at the interface between the floating gate and the tunnel insulating layer. Further, there is produced a complete depletion layer, which is completely depleted, between the incomplete depletion layer and the tunnel insulating layer.

However, practically, since width of the complete depletion layer is extremely narrow, the depletion layer of the floating gate comprised polysilicon is controlled by the incomplete depletion layer (for instance, refer to H. Watanabe, IEEE TED52, 2265, 2005).

It should be noted that a depletion approximation used in themes of a conventional manner like a non-degenerate silicon assumes complete depletion, and thus, when evaluating width of the depletion layer in this manner, the width of the depletion layer is underestimated. For this reason, the width of the depletion layer caused by the depletion approximation becomes narrower than the width of the depletion layer produced at the time of practical write.

This means that the depletion layer hitherto disregarded largely influences write characteristic with the memory cell miniaturized. Specifically, although the depletion layer produced in the interface between the floating gate and the tunnel insulating layer lowers the electric field applied to the tunnel insulating layer, the phenomenon becomes one of risk factors of characteristic deterioration when write margin becomes small.

Continuously, there will be described an effect which the accumulation layer exerts on the write efficiency.

The accumulation layer of the polysilicon is completely disregarded in viewpoint on the basis of Boltzmann's approximation. The reason is considered to be the following. That is, since the donor concentration of the polysilicon is extremely high, even though a band is bent on the surface of the polysilicon, electrons are immediately deposited there exponentially to return to an original state. Therefore, actually, the band is not practically bent.

However, this way of thinking is not correct (for instance, refer to H. Watanabe et al, Ext. Abs. SSDM, 504, 2005).

Figure 6:
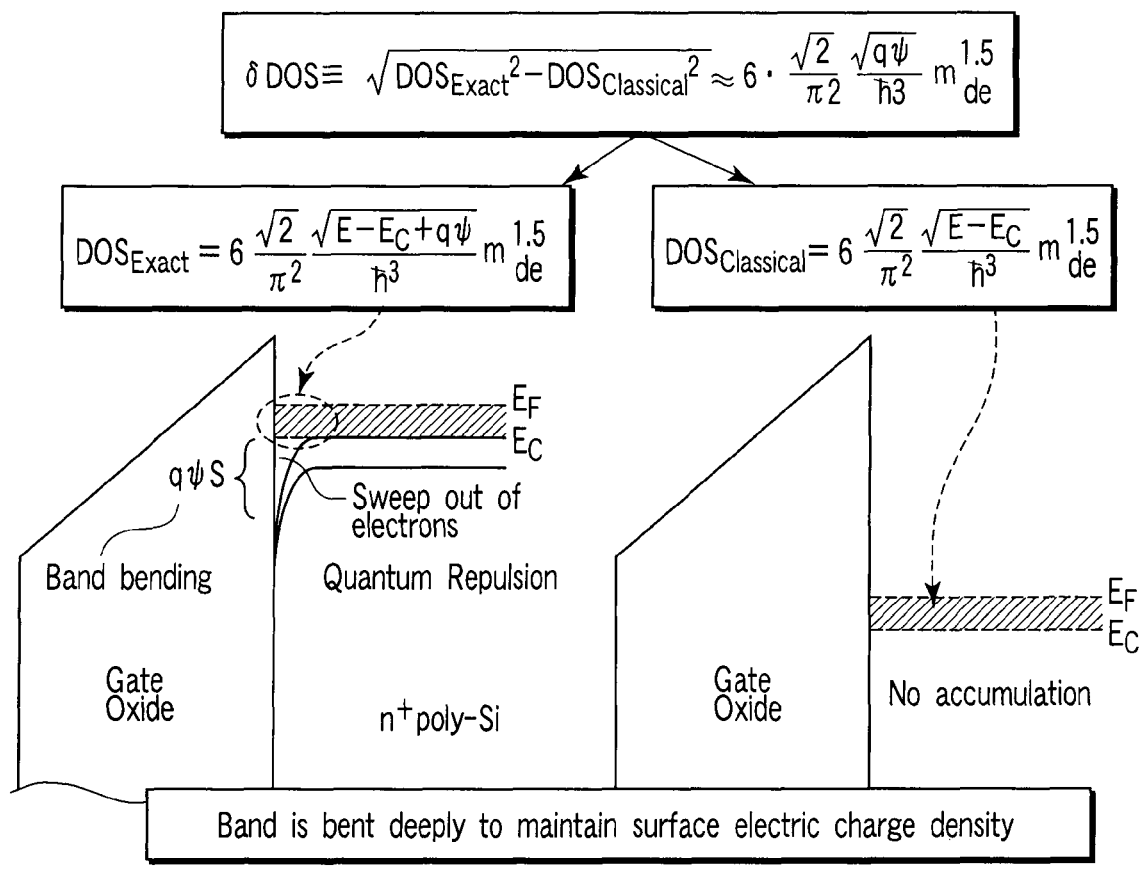
FIG. 6 is a view showing a mechanism of generation of a weak accumulation layer.

As shown in FIG. 6, in the polysilicon, exponential accumulation of electrons does not occur caused by quantum exclusion effect because the width of the accumulation layer is narrow. Instead, the band-bending becomes far larger than expected in past several decades, and the density of states of the electrons increases with square root in accordance with the band-bending.

Therefore, the accumulation layer is produced on the surface of the polysilicon.

The accumulation layer is called "weak accumulation layer" because the electrons are deposited on the surface of the polysilicon not with the exponential function but with the square root function.

Figure 7:
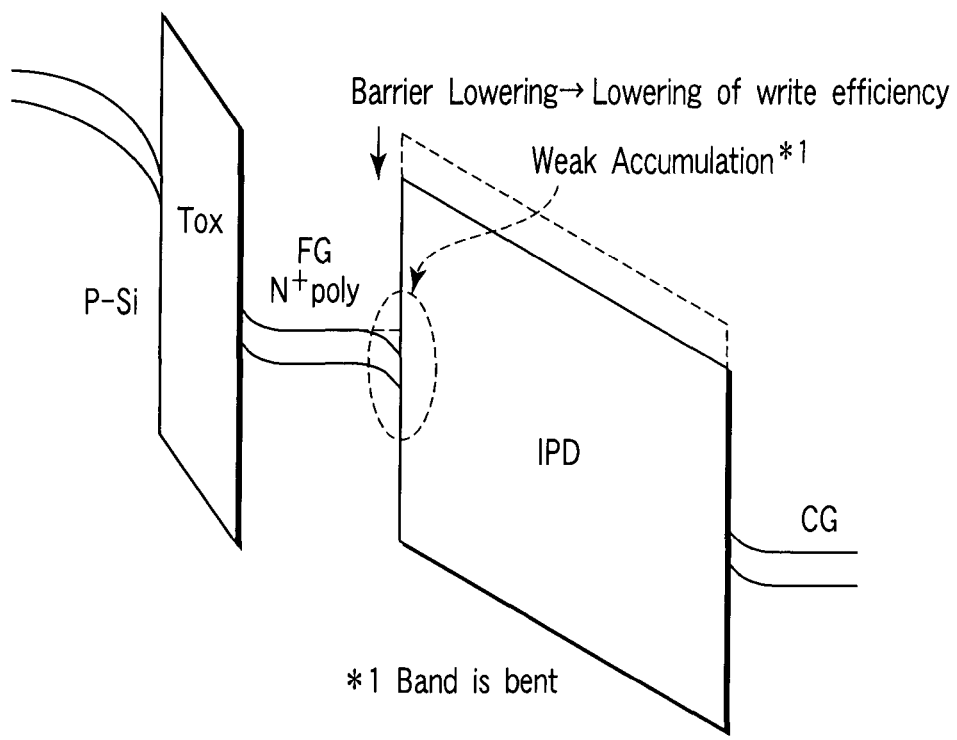
FIG. 7 is a view showing a mechanism in which the weak accumulation layer becomes a cause of the IPD leak.

FIG. 7 shows that, at the time of write, the weak accumulation layer produced at the interface between the floating gate and the IPD lowers a tunnel barrier of the IPD.

As a result, this phenomenon lowers the write efficiency to a large extent, because it increases the IPD leak exponentially.

Accordingly, in order to eliminate the influences of the incomplete depletion layer and the weak accumulation layer, there is an approach of composing the floating gate not with the polysilicon but with metal.

However, as shown in FIG. 2, when composing the floating gate of metal, the depletion layer is not formed on the side surface of the floating gate. Thus, capacitance caused by the FG fringe coupling is not suppressed. As described already, this becomes a factor avoiding miniaturization of the memory cell, because the capacitive coupling ratio of the memory cell is caused to lower.

3. Embodiments

Next, there will be described some embodiments considered as the best.

(1) First Embodiment

A. Structure

Figure 8:
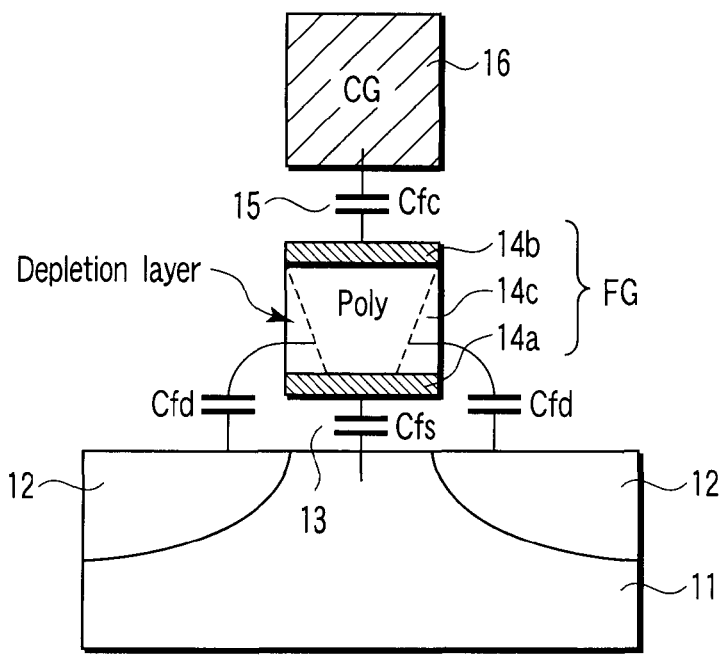
FIG. 8 is a view showing a gate electrode structure of the memory cell of a first embodiment.

FIG. 8 shows a gate electrode structure of a first embodiment.

Diffusion layers 12 as source/drain are formed on a surface region of a semiconductor substrate 11. A floating gate FG is formed via a gate insulating layer (tunnel insulating layer) 13 on a channel between the diffusion layers 12.

The gate insulating layer 13 is comprised, for instance, silicon oxide.

The floating gate FG having a three-layer structure is formed in the order of a metal layer 14a, a polysilicon layer 14c and a metal layer 14b from the gate insulating layer 13 side.

The metal layers 14a, 14b are provided so as not to produce the incomplete depletion layer and the weak accumulation layer on both an upper surface and a lower surface of the floating gate FG. The respective thicknesses of the metal layers 14a, 14b are made to be not less than 0.4 nm in order to bring out such function sufficiently.

The metal layers 14a, 14b are selected from the group including aluminum, platinum, copper, gold and alloys thereof.

The polysilicon layer 14c arranged between the metal layers 14a, 14b occupies a center part of the floating gate FG. For this reason, the depletion layer is formed on the side surface of the floating gate FG (polysilicon layer 14c), and thus the capacitance Cfd due to the FG fringe coupling becomes small.

A control gate electrode CG is formed via an IPD 15 on the floating gate FG.

The IPD 15 is comprised, for instance, a silicon oxide/silicon nitride/silicon oxide (ONO) stack structure. The control gate electrode CG is comprised, for instance, polysilicon, a silicide, metal or a stack structure thereof.

B. Manufacturing Method

There will be described an example of a method of manufacturing a stacked structure of FIG. 8.

Figure 9:
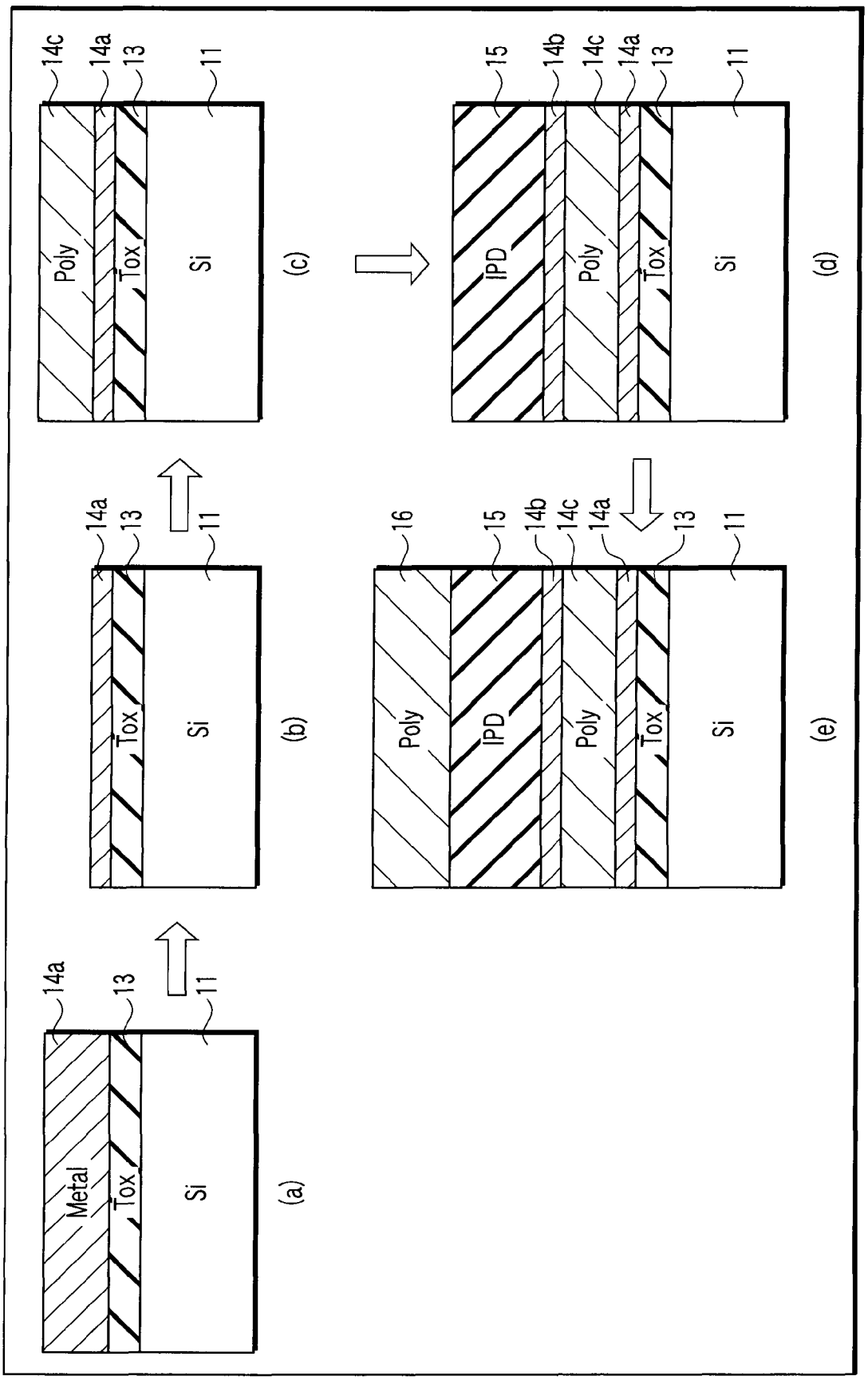
FIG. 9 is a view showing a method of manufacturing the gate electrode structure of FIG. 8.

Firstly, as shown in FIG. 9A, a silicon oxide layer (gate insulating layer) 13 is formed on the silicon substrate (semiconductor substrate) 11 by a thermal oxidation method or by another conventional manner. Continuously, the metal layer 14a is formed on the silicon oxide layer 13 by a sputtering method. After that, as shown in FIG. 9B, the thickness of the metal layer 14a is made to be a predetermined value of not less than 0.4 nm, for instance, approximately 0.5 nm, in such a way that the metal layer 14a is subjected to the etch-back.

Next, as shown in FIG. 9C, a conductive polysilicon layer 14c including impurities is formed with a thickness of, for instance, approximately 50 nm on the metal layer 14a by the CVD method. Continuously, as shown in FIG. 9D, the metal layer 14b is formed with a thickness of, for instance, approximately 0.5 nm on the polysilicon layer 14c by the sputtering method. After that, the IPD 15 is formed on the metal layer 14b by the CVD method or by another conventional manner.

Next, as shown in FIG. 9E, a conductive polysilicon layer 16 including impurities is formed on the IPD 15 by the CVD method.

Then, a mask pattern is formed by photolithography, and by using this mask pattern, the polysilicon layer 16, the IPD 15, the metal layer 14b, the polysilicon layer 14c, the metal layer 14a or the silicon oxide layer 13 are etched sequentially, so that a gate electrode of the memory cell is completed.

C. Advantage

In this manner, according to the first embodiment, the floating gate has a sandwich structure sandwiching the polysilicon layer by two metal layers.

Therefore, since the incomplete depletion layer and the weak accumulation layer are not produced, and the FG fringe coupling becomes weak, it is possible to contribute to improvement of the capacitive coupling ratio of the memory cell and miniaturization of the memory cell due to decrease of the IPD leak.

(2) Second Embodiment

A. Structure

FIG. 10 shows a stacked structure of a second embodiment.

Diffusion layers 12 as source/drain are formed on a surface region of a semiconductor substrate 11. A floating gate FG is formed via a gate insulating layer (tunnel insulating layer) 13 on a channel between the diffusion layers 12.

The gate insulating layer 13 is comprised, for instance, silicon oxide.

The floating gate FG having a three-layer structure is formed in the order of a silicide layer 17a, a polysilicon layer 14c and a silicide layer 17b from the gate insulating layer 13 side.

The silicide layers 17a, 17b are provided so as not to produce the incomplete depletion layer or the weak accumulation layer on both an upper surface and a lower surface of the floating gate FG. The respective thicknesses of the silicide layers 17a, 17b are made to be not less than 0.4 nm in order to bring out such function sufficiently.

The silicide layers 17a, 17b are selected from the group including cobalt silicide, nickel silicide, tungsten silicide, titanium silicide, tantalum silicide, and ruthenium silicide.

The polysilicon layer 14c arranged between the silicide layers 17a, 17b occupies a center part of the floating gate FG. For this reason, the depletion layer is formed on the side surface of the floating gate FG (polysilicon layer 14c), and thus the capacitance Cfd due to the FG fringe coupling becomes small.

A control gate electrode CG is formed via an IPD 15 on the floating gate FG.

The IPD 15 is comprised, for instance, a silicon oxide/silicon nitride/silicon oxide (ONO) stack structure. The control gate electrode CG is comprised, for instance, polysilicon, a silicide, metal or a stack structure thereof.

B. Manufacturing Method

There will be described an example of a method of manufacturing a gate electrode structure of FIG. 10.

Figure 11:
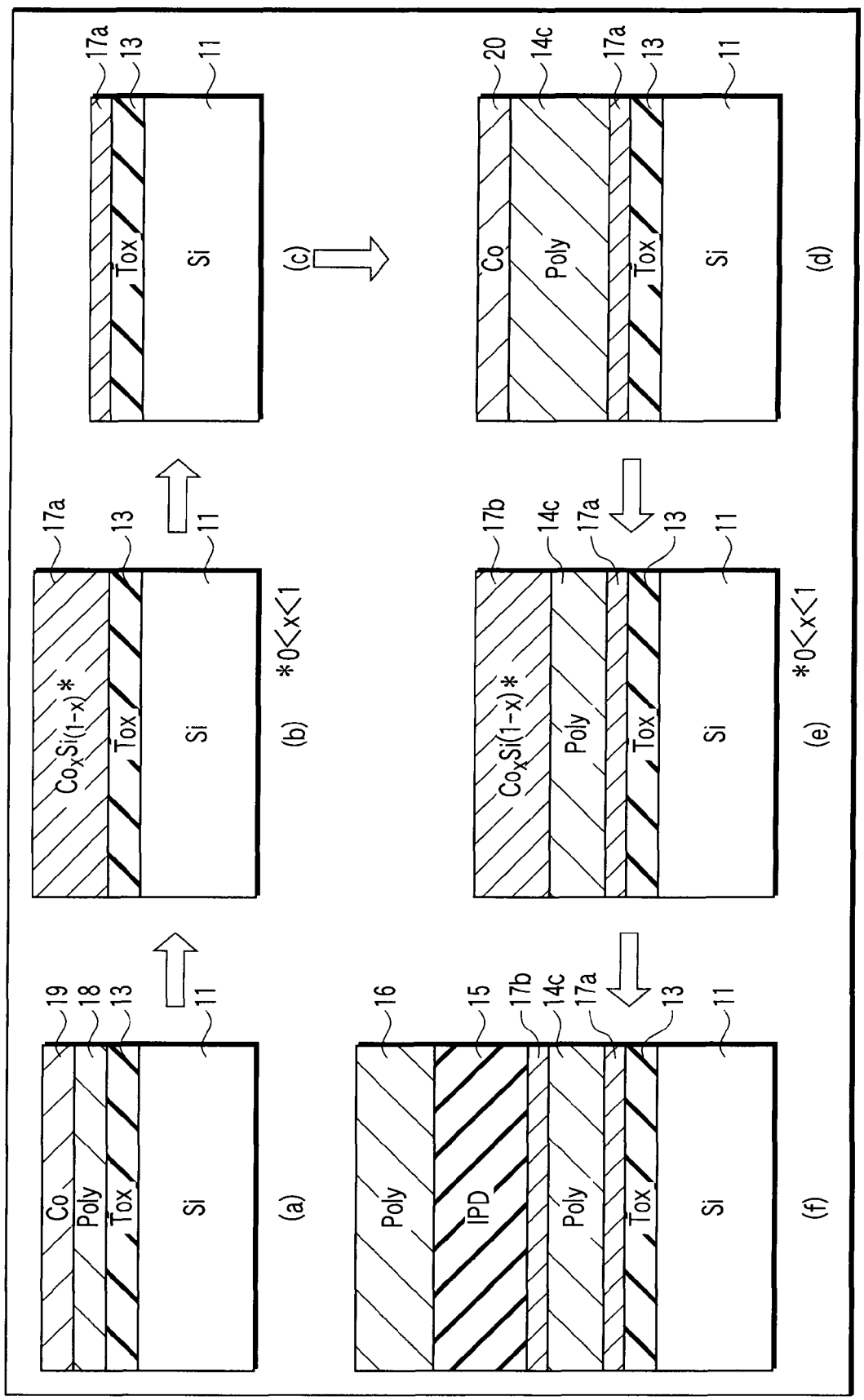
FIG. 11 is a view showing a method of manufacturing the gate electrode structure of FIG. 10.

Firstly, as shown in FIG. 11A, a silicon oxide layer (gate insulating layer) 13 is formed on the silicon substrate (semiconductor substrate) 11 by a thermal oxidation method or by another conventional manner. Further, a polysilicon layer 18 is formed on the silicon oxide layer 13 by the CVD method.

Continuously, a cobalt (Co) layer 19 is formed on the polysilicon layer 18 by the sputtering method. After that, when silicon atoms in the polysilicon layer 18 and cobalt atoms in the cobalt layer 19 are caused to diffuse to react with each other by annealing, as shown in FIG. 11B, a cobalt silicide ($Co_xSi_{1-x}(0<x<1)$) layer 17a is formed.

Next, as shown in FIG. 11C, the thickness of the cobalt silicide layer 17a is made to be a predetermined value of not less than 0.4 nm, for instance, approximately 0.5 nm, in such a way that the cobalt silicide layer 17a is subjected to the etch-back.

Next, as shown in FIG. 11D, a conductive polysilicon layer 14c including impurities is formed on the cobalt silicide layer 17a by the CVD method. Further, a cobalt layer 20 is formed on the polysilicon layer 14c by the sputtering method. After that, when silicon atoms in the polysilicon layer 14c and cobalt atoms in the cobalt layer 20 are caused to diffuse to react with each other by annealing, as shown in FIG. 11E, a cobalt silicide ($Co_xSi_{1-x}(0<x<1)$) layer 17b is formed.

At this time, not the whole polysilicon layer 14c but only a part thereof at its cobalt layer side is made into a silicide. Further, an annealing condition is set so that the thickness of the remaining polysilicon layer 14c after annealing becomes a predetermined value, for instance, approximately 50 nm.

Next, as shown in FIG. 11F, the thickness of the cobalt silicide layer 17b is made to be a predetermined value of not less than 0.4 nm, for instance, approximately 0.5 nm, in such a way that the cobalt silicide layer 17b is subjected to the etch-back. After that, by the CVD method or by another conventional manner, the IPD 15 is formed on the cobalt silicide layer 17b, and the conductive polysilicon layer 16 including impurities is formed on the IPD 15.

Then, a mask pattern is formed by photolithography, and by using this mask pattern, the polysilicon layer 16, the IPD 15, the cobalt silicide layer 17b, the polysilicon layer 14c, the cobalt silicide layer 17a or the silicon oxide layer 13 are etched sequentially, so that a gate electrode of the memory cell is completed.

Note that, although the cobalt layers 19, 20 are used in the present example, it is possible to use materials constituting a metal silicide layer while reacting with silicon such as a nickel layer, a tungsten layer, a titanium layer, a tantalum layer, a and ruthenium layer.

C. Advantage

In this manner, according to the second embodiment, the floating gate has a sandwich structure sandwiching the polysilicon layer by two silicide layers.

Therefore, since the incomplete depletion layer and the weak accumulation layer are not produced, and the FG fringe coupling becomes weak, it is possible to contribute to improvement of the capacitive coupling ratio of the memory cell and miniaturization of the memory cell due to decrease of the IPD leak.

(3) Third Embodiment

A. Structure

FIG. 12 shows a stacked structure of a third embodiment.

Diffusion layers 12 as source/drain are formed on a surface region of a semiconductor substrate 11. A floating gate FG is formed via a gate insulating layer (tunnel insulating layer) 13 on a channel between the diffusion layers 12.

The gate insulating layer 13 is comprised, for instance, silicon oxide.

The floating gate FG having a three-layer structure is formed in the order of a silicide layer 17a, a polysilicon layer 14c and a metal layer 14b from the gate insulating layer 13 side.

The silicide layer 17a is provided so as not to produce the incomplete depletion layer or the weak accumulation layer on a lower surface of the floating gate FG, and the metal layer 14b is provided so as not to produce the incomplete depletion layer or the weak accumulation layer on an upper surface of the floating gate FG. The respective thicknesses of the silicide layer 17a and the metal layer 14b are made to be not less than 0.4 nm in order to bring out such function sufficiently.

The silicide layer 17a is selected from the group including cobalt silicide, nickel silicide, tungsten silicide, titanium silicide, tantalum silicide, and ruthenium silicide.

The metal layer 14b is selected from the group including aluminum, platinum, copper, gold and alloys thereof.

The polysilicon layer 14c arranged between the silicide layer 17a and the metal layer 14b occupies a center part of the floating gate FG. For this reason, the depletion layer is formed on the side surface of the floating gate FG (polysilicon layer 14c), and thus the capacitance Cfd due to the FG fringe coupling becomes small.

A control gate electrode CG is formed via and IPD 15 on the floating gate FG.

The IPD 15 is comprised, for instance, ONO (silicon oxide/silicon nitride/silicon oxide) stack structure. The control gate electrode CG is comprised, for instance, polysilicon, a silicide, metal or a stack structure thereof.

B. Manufacturing Method

There will be described an example of a method of manufacturing the stacked structure of FIG. 12.

Figure 13:
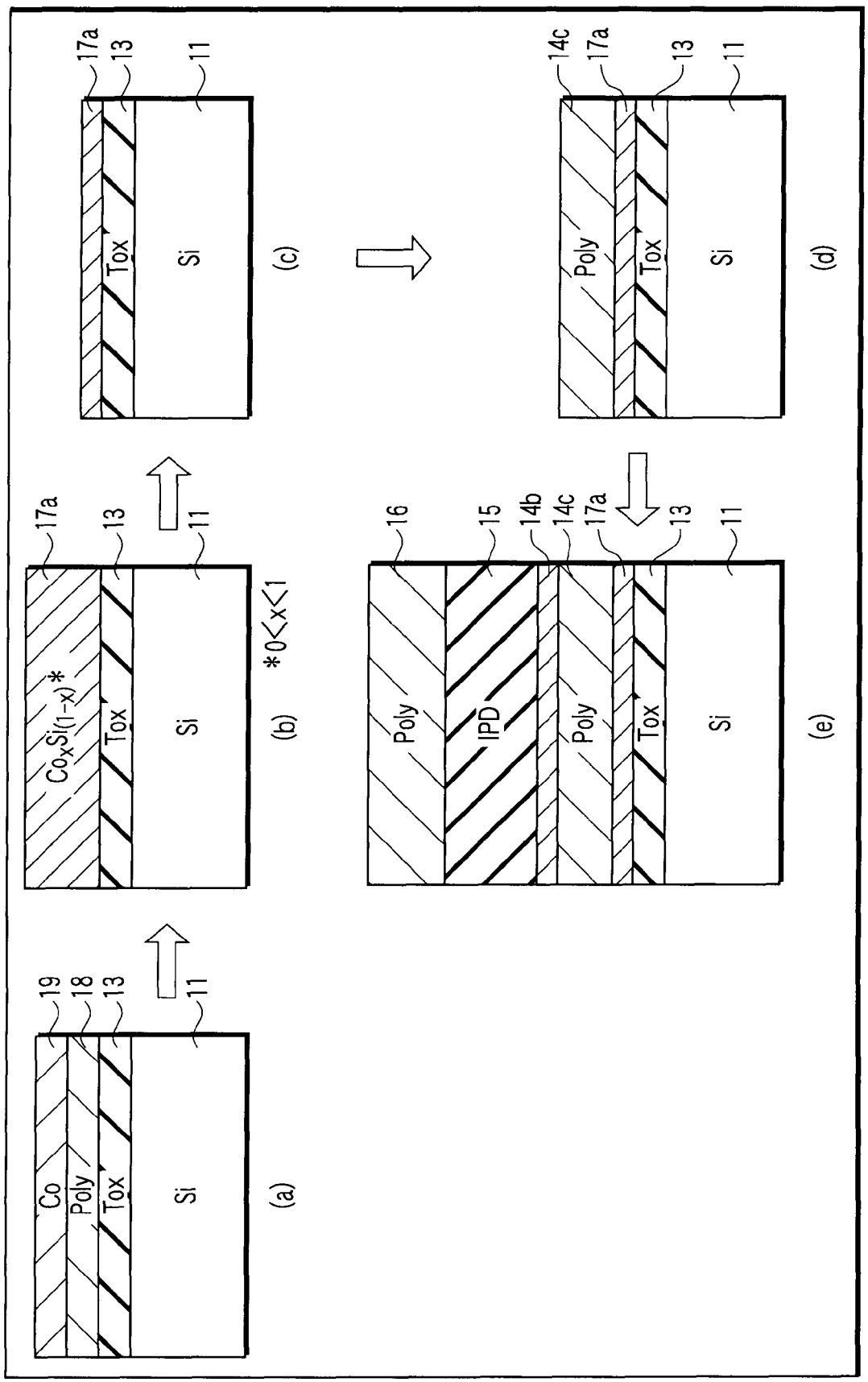
FIG. 13 is a view showing a method of manufacturing the gate electrode structure of FIG. 12.

Firstly, as shown in FIG. 13A, a silicon oxide layer (gate insulating layer) 13 is formed on the silicon substrate (semiconductor substrate) 11 by a thermal oxidation method or by another conventional manner. Further, a polysilicon layer 18 is formed on the silicon oxide layer 13 by the CVD method.

Continuously, a cobalt (Co) layer 19 is formed on the polysilicon layer 18 by the sputtering method. After that, when silicon atoms in the polysilicon layer 18 and cobalt atoms in the cobalt layer 19 are caused to diffuse to react with each other by annealing, as shown in FIG. 13B, a cobalt silicide ($Co_xSi_{1-x}(0<x<1)$) layer 17a is formed.

Next, as shown in FIG. 13C, the thickness of the cobalt silicide layer 17a is made to be a predetermined value of not less than 0.4 nm, for instance, approximately 0.5 nm, in such a way that the cobalt silicide layer 17a is subjected to the etch-back. Further, as shown in FIG. 13D, a conductive polysilicon layer 14c including impurities is formed on the cobalt silicide layer 17a by the CVD method, with a thickness of, for instance, approximately 50 nm.

Next, as shown in FIG. 13E, the metal layer 14b is formed with a thickness of, for instance, approximately 0.5 nm on the polysilicon layer 14c by the sputtering method. After that, by the CVD method or by another conventional manner, the IPD 15 is formed on the metal layer 14b, and a conductive polysilicon layer 16 including impurities is formed on the IPD 15.

Then, a mask pattern is formed by photolithography, and by using this mask pattern, the polysilicon layer 16, the IPD 15, the metal layer 14b, the polysilicon layer 14c, the cobalt silicide layer 17a or the silicon oxide layer 13 are etched sequentially, so that a gate electrode of the memory cell is completed.

Note that, although the cobalt layer 19 is used in the present example, it is possible to use materials constituting a metal silicide layer while reacting with silicon such as a nickel layer, a tungsten layer, a titanium layer, a tantalum layer, and a ruthenium layer.

C. Advantage

In this manner, according to the third embodiment, the floating gate has a sandwich structure sandwiching the polysilicon layer between the silicide layer and the metal layer.

Therefore, since the incomplete depletion layer and the weak accumulation layer are not produced, and the FG fringe coupling becomes weak, it is possible to contribute to improvement of the capacitive coupling ratio of the memory cell and miniaturization of the memory cell due to decrease of the IPD leak.

(4) Fourth embodiment

A. Structure

FIG. 14 shows a gate electrode structure of a fourth embodiment.

Diffusion layers 12 as source/drain are formed on a surface region of a semiconductor substrate 11. A floating gate FG is formed via a gate insulating layer (tunnel insulating layer) 13 on a channel between the diffusion layers 12.

The gate insulating layer 13 is comprised, for instance, silicon oxide.

The floating gate FG having a three-layer structure is formed in the order of a metal layer 14a, a polysilicon layer 14c and a silicide layer 17b from the gate insulating layer 13 side.

The metal layer 14a is provided so as not to produce the incomplete depletion layer or the weak accumulation layer on a lower surface of the floating gate FG, and the silicide layer 17b is provided so as not to produce the incomplete depletion layer or the weak accumulation layer on an upper surface of the floating gate FG. The respective thicknesses of the metal layer 14a and the silicide layer 17b are made to be not less than 0.4 nm in order to bring out such function sufficiently.

The metal layer 14a is selected from the group including aluminum, platinum, copper, gold and alloys thereof.

The silicide layer 17b is selected from the group including cobalt silicide, nickel silicide, tungsten silicide, titanium silicide, tantalum silicide, and ruthenium silicide.

The polysilicon layer 14c arranged between the metal layer 14a and the silicide layer 17b occupies a center part of the floating gate FG. For this reason, the depletion layer is formed on the side surface of the floating gate FG (polysilicon layer 14c), and thus the capacitance Cfd due to the FG fringe coupling becomes small.

A control gate electrode CG is formed via an IPD 15 on the floating gate FG.

The IPD 15 is comprised, for instance, a silicon oxide/silicon nitride/silicon oxide (ONO) stack structure. The control gate electrode CG is comprised, for instance, polysilicon, silicide, metal or a stack structure thereof.

B. Manufacturing Method

There will be described an example of a method of manufacturing the stacked structure of FIG. 14.

Figure 15:
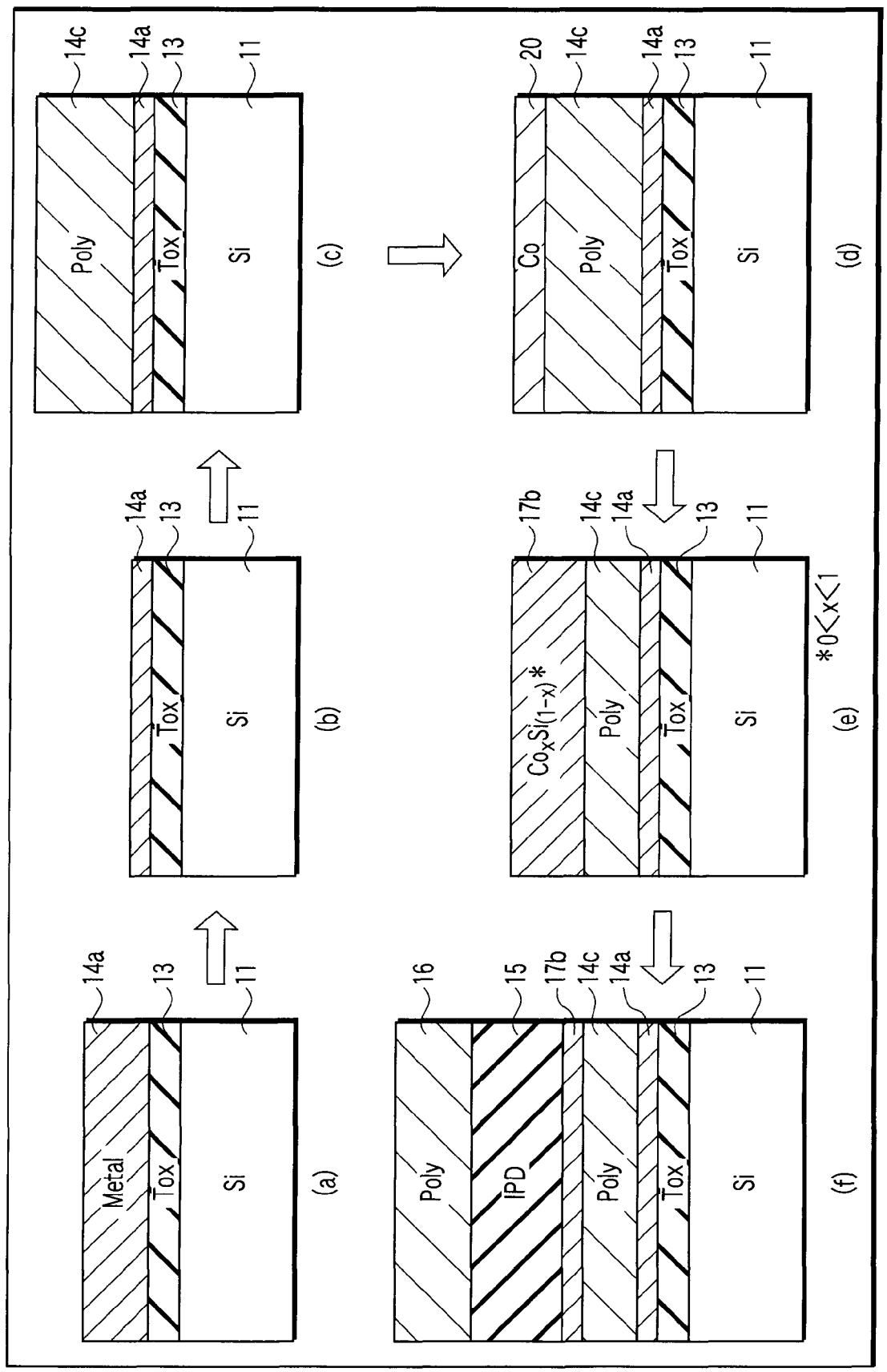
FIG. 15 is a view showing a method of manufacturing the gate electrode structure of FIG. 14.

Firstly, as shown in FIG. 15A, a silicon oxide layer (gate insulating layer) 13 is formed on the silicon substrate (semiconductor substrate) 11 by a thermal oxidation method or by another conventional manner. Further, the metal layer 14a is formed on the silicon oxide layer 13 by a sputtering method. After that, as shown in FIG. 15B, the thickness of the metal layer 14a is made to be a predetermined value of not less than 0.4 nm, for instance, approximately 0.5 nm, in such a way that the metal layer 14a is subjected to the etch-back.

Next, as shown in FIG. 15C, a conductive polysilicon layer 14c including impurities is formed on the metal layer 14a by the CVD method. Further, as shown in FIG. 15D, the cobalt layer 20 is formed on the polysilicon layer 14c by the sputtering method. After that, when silicon atoms in the polysilicon layer 14c and cobalt atoms in the cobalt layer 20 are caused to diffuse to react with each other by annealing, as shown in FIG. 15E, a cobalt silicide ($Co_xSi_{(1-x)}$; $0<x<1$) layer 17b is formed.

At this time, not the whole polysilicon layer 14c but only a part thereof at its cobalt layer side is made into a silicide. Further, an annealing condition is set so that the thickness of the remaining polysilicon layer 14c after annealing becomes a predetermined value, for instance, approximately 50 nm.

Next, as shown in FIG. 15F, the thickness of the cobalt silicide layer 17b is made to be a predetermined value of not less than 0.4 nm, for instance, approximately 0.5 nm, in such a way that the cobalt silicide layer 17b is subjected to the etch-back. After that, by the CVD method or by another conventional manner, the IPD 15 is formed on the cobalt silicide layer 17b, and a conductive polysilicon layer 16 including impurities is formed on the IPD 15.

Then, a mask pattern is formed by photolithography, and by using this mask pattern, the polysilicon layer 16, the IPD 15, the cobalt silicide layer 17b, the polysilicon layer 14c, the metal layer 14a or the silicon oxide layer 13 are etched sequentially, so that a gate electrode of the memory cell is completed.

Note that, although the cobalt layers 20 is used in the present example, it is possible to use materials constituting a metal silicide layer while reacting with silicon such as a nickel layer, a tungsten layer, a titanium layer, a tantalum layer, and a ruthenium layer.

C. Advantage

In this manner, according to the fourth embodiment, the floating gate has a sandwich structure sandwiching the polysilicon layer between the metal layer and the silicide layer.

Therefore, since the incomplete depletion layer and the weak accumulation layer are not produced, and the FG fringe coupling becomes weak, it is possible to contribute to improvement of the capacitive coupling ratio of the memory cell and miniaturization of the memory cell due to decrease of the IPD leak.

(5) Fifth Embodiment

A fifth embodiment relates to a technique for suppressing interference between cells (inter-cell interference) in the case where the gate electrode structure of the first to fourth embodiments are applied to a nonvolatile semiconductor memory having a cell array structure where a plurality of memory cells are adjacent to one another, for instance, a NAND-type flash memory.

FIG. 16 shows a state of the inter-cell interference.

The inter-cell interference is mainly produced in a direction vertical to a direction in which a word line (control gate electrode CG) extends, that is, the inter-cell interference is produced between two memory cells adjacent to each other in y direction. In the gate electrode structure according to the examples of the present invention, since the floating gate has the three-layer structure, the inter-cell interference can be represented with capacitances Ca, Cb, and Cc.

Here, as shown in FIG. 17, when setting the thickness of the conductive layers 14b, 17b of the IPD side to "α", setting the thickness of the polysilicon layer 14c to "β", and setting the thickness of the conductive layers 14a, 17a of the gate insulating layer (tunnel insulating layer) side to "γ", and further, setting an interval between the floating gates of the two memory cells adjacent to each other to "S", firstly, there is obtained relationship as shown in FIG. 18.

This is the relation between the interval S (nm) between the floating gates of the two memory cells adjacent to each other, and a difference Δ Capacitance (%) between capacitance-between-cells in the case where the memory cell has the floating gate of the polysilicon structure and capacitance-between-cells in the case where the memory cell has the floating gate of the metal structure.

Understood from the relation is that the narrower the interval S between cells becomes, the larger is the difference Δ Capacitance (%) between the both two-capacitance-between-cells. That is, in the memory cell having the floating gate FG of the metal structure, the capacitance-between-cells produced between the floating gates of the two memory cells being adjacent to each other becomes large as compared to the memory cell having the floating gate FG of the polysilicon structure.

The relation is expressed as follows:

$$Y (=\Delta \text{ Capacitance in \%}) = -2.2 \text{ nm}^{-1} \times X (=S \text{ nm}) + 24.$$

What is meant is that, in the case of the gate electrode of the three-layer structure of the example of the present invention, the larger is the value where the sum of the thickness of the conductive layers 14a, 17a and of the conductive layers 14b, 17b is divided by the thickness of the polysilicon layer being a semiconductor layer, the larger is the capacitance-between-cells, so that there occurs the same problem as the memory cell having the floating gate of the metal structure.

Therefore, when applying the gate electrode structure according to the example of the present invention to the nonvolatile semiconductor memory, the value obtained in such a way that the sum of the thickness of the conductive layers 14a, 17a and of the conductive layers 14b, 17b is divided by the thickness of the polysilicon layer being the semiconductor layer should be at least larger than Y (=−2.2× X+24) in %.

That is, if the relation:

$$100 \times (\alpha + \gamma) / \beta < -2.2 \times S + 24 \quad (1)$$

is satisfied, there is not produced the problem that is produced in the conventional floating gate FG of the metal structure.

Note that the parameter S is the interval between the floating gates of the two memory cells adjacent to each other. However, there is produced process variation in the interval S, and therefore, on the design, the interval is targeted to be a statistically permissible minimum value of the cell interval in light of yield.

Further, in the present example, although the two adjoining memory cells in the direction (y direction) vertical to the word line are treated, the memory cells also adjoin with each other in the extending direction (x direction) along the word line.

Therefore, it is necessary to perform the same investigation for the two memory cells adjacent to each other in the direction along the word line.

In this case, although there is no problem if the interval S of the both is identical, in the case of being different, "α", "β" and "65" are determined so as to satisfy the above formula (1) while using the smaller interval S.

(6) Sixth Embodiment

A sixth embodiment relates to a shape of the floating gate. The present embodiment is used in combination with the gate electrode structure of the first to fourth embodiments.

FIGS. 19 to 22 shows a gate electrode structure of the sixth embodiment.

Figure 19:
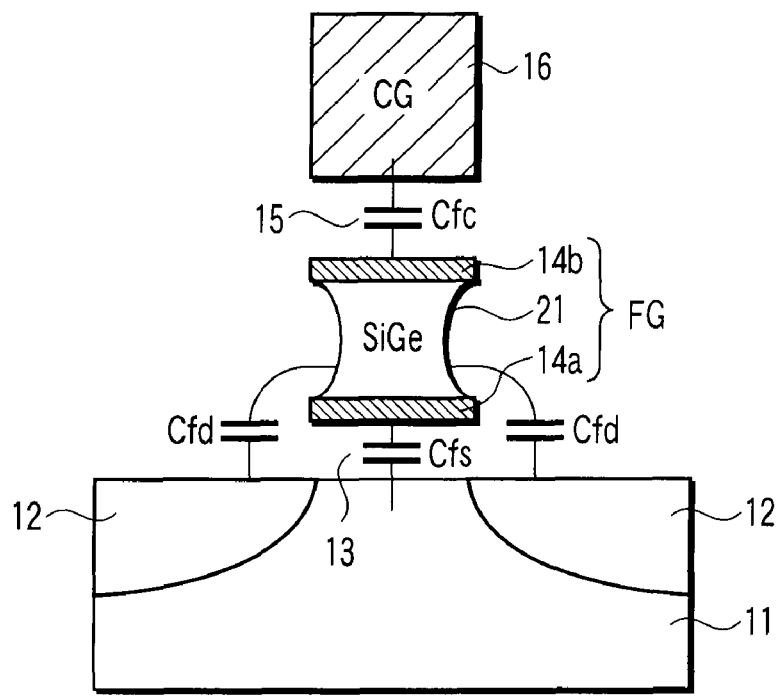
FIG. 19 is a view showing a gate electrode structure of a sixth embodiment.
Figure 20:
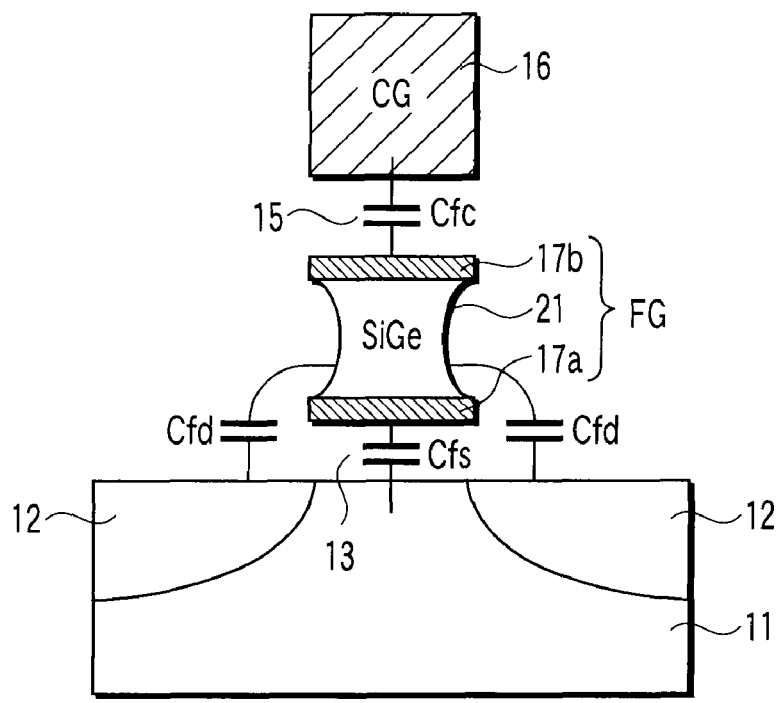
FIG. 20 is a view showing the gate electrode structure of the sixth embodiment.

FIG. 19 corresponds to the gate electrode structure of the first embodiment, FIG. 20 corresponds to the gate electrode structure of the second embodiment, FIG. 21 corresponds to the gate electrode structure of the third embodiment, and FIG. 22 corresponds to the gate electrode structure of the fourth embodiment.

A characteristic of the gate electrode structure of the present example is that a center part of a semiconductor layer 21 arranged between first conductive layers (metal layer or silicide layer) 14a, 17a and second conductive layers (metal layer or silicide layer) 14b, 17b is constricted, so that, as a whole, a floating gate FG becomes a shape such as a center part constricted hand drum shape.

In the first to fourth embodiments, it is assumed that the semiconductor layer occupying a center part of the floating gate FG is polysilicon. However, in the present embodiment, a compound semiconductor such as silicon germanium (SiGe) is used.

This is because an etching rate of the compound semiconductor such as silicon germanium is fast compared with the other material, and thus it is easy to form the center part constricted drum shape.

FIG. 23 shows an example of a method of manufacturing the gate electrode structure of FIGS. 19 to 22.

FIG. 23A, which is a layered structure obtained by the manufacturing method described in the first to fourth embodiments while the sandwiched polysilicon 14c is replaced by the silicon germanium, shows a state before patterning of the gate electrode.

After that, as shown in FIG. 23B, for instance, when etching each layer by RIE, there is completed the floating gate FG with the center part constricted drum shape because the etching rate of the semiconductor layer 21 is fast. Further, with respect to layers other than the semiconductor layer 21, a side surface becomes approximately vertical to the surface of the semiconductor substrate 11.

Further, when performing ion implantation of impurities into the semiconductor substrate 11 in a self-aligning manner while using the gate electrode of such a stack gate structure as a mask, the diffusion layers 12 as the source/drain are formed.

According to the sixth embodiment, since the center part of the semiconductor layer 21 is constricted, it is possible to suppress problems such as lowering of the capacitive coupling ratio caused by the FG fringe coupling or increase of the inter-cell interference into a minimum level.

(7) Others

As described above, according to the examples of the present invention, there is proposed the gate electrode structure in which only a part where the incomplete depletion layer and the weak accumulation layer are produced is metallized or made into a silicide. Accordingly, it is possible to effectively prevent generation of the incomplete depletion layer and the weak accumulation layer without increasing capacitance caused by the FG fringe coupling and capacitance-between-cells. Further, it is possible to simultaneously solve the problem of the inter-cell interference caused by miniaturization of the memory cell upon controlling the thickness of the part being metallized or made into a silicide.

The gate electrode structure of the memory cell of the nonvolatile semiconductor memory according to the examples of the present invention can be applied to a general nonvolatile semiconductor memory having the memory cell of the stack gate structure, and in particular, it is thought that the gate electrode structure is very effective for the NAND-type flash memory in which miniaturization of the memory cell is noticeable.

4. Conclusion

According to the examples of the present invention, it is possible to contribute to miniaturization of the memory cell, in such a way that, due to a new gate electrode structure, the IPD leak is suppressed, and the variation width of the threshold of the memory cell is controlled accurately.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a memory cell comprising:
   a semiconductor substrate;
   a first insulating layer on the semiconductor substrate;
   a floating gate on the first insulating layer;
   a second insulating layer on the floating gate; and
   a control gate electrode on the second insulating layer,
   wherein the floating gate comprises a first conductive layer which is in contact with the first insulating layer, a second conductive layer which is in contact with the second insulating layer, and a semiconductor layer between the first and second conductive layers, and each of the first and second conductive layers is a metal layer or a silicide layer.

2. The nonvolatile semiconductor memory according to claim 1, wherein each of the first and second conductive layers is the metal layer.

3. The nonvolatile semiconductor memory according to claim 1, wherein each of the first and second conductive layers is silicide layers.

4. The nonvolatile semiconductor memory according to claim 1, wherein the first conductive layer is the metal layer and the second conductive layer is the silicide layer.

5. The nonvolatile semiconductor memory according to claim 1, wherein the first conductive layer is the silicide layer and the second conductive layer is the metal layer.

6. The nonvolatile semiconductor memory according to claim 1, wherein the metal layer is selected from the group consisting of aluminum, platinum, copper, gold and alloys thereof.

7. The nonvolatile semiconductor memory according to claim 1, wherein the silicide layer is selected from the group consisting of cobalt silicide, nickel silicide, tungsten silicide, titanium silicide, tantalum silicide, and ruthenium silicide.

8. The nonvolatile semiconductor memory according to claim 1, wherein each thickness of the first and second conductive layers is 0.4 nm or more.

9. The nonvolatile semiconductor memory according to claim 1, wherein the semiconductor memory comprising at least two said memory cells adjacent to each other, and a value obtained in such a way that the sum of the thicknesses of the first and second conductive layers is divided by the thickness of the semiconductor layer is smaller than $-0.022$ nm$^{-1} \times$ (interval between the floating gates of two memory cells adjacent to each other) $+0.24$.

10. A nonvolatile semiconductor memory comprising:
    a memory cell comprising:
    a semiconductor substrate;
    a first insulating layer on the semiconductor substrate;
    a floating gate on the first insulating layer;
    a second insulating layer on the floating gate; and
    a control gate electrode on the second insulating layer,
    wherein the floating gate comprises a first conductive layer which is in contact with the first insulating layer, a second conductive layer which is in contact with the second insulating layer, and a semiconductor layer having a shape in which a center part is constricted and arranged between the first and second conductive layers, and each of the first and second conductive layers is metal layer or silicide layer.

11. The nonvolatile semiconductor memory according to claim 10, wherein the metal layer comprises one metal selected from the group consisting of aluminum, platinum, copper, gold and an alloy thereof, and the silicide layer is selected from the group consisting of cobalt silicide, nickel silicide, tungsten silicide, titanium silicide, tantalum silicide, and ruthenium silicide.

12. The nonvolatile semiconductor memory according to claim 10, wherein each thickness of the first and second conductive layers is 0.4 nm or more.

13. The nonvolatile semiconductor memory according to claim 10, wherein the semiconductor layer comprises a compound semiconductor including silicon germanium.

14. The nonvolatile semiconductor memory according to claim 10, wherein the semiconductor memory comprises at least two said memory cells adjacent to each other, and a value obtained in such a way that the sum of the thicknesses of the first and second conductive layers is divided by the thickness of the semiconductor layer is smaller than $-0.022$ nm$^{-1} \times$ (interval between the floating gates of two memory cells adjacent to each other) $+0.24$.

15. The nonvolatile semiconductor memory according to claim 10, further comprising diffusion layers in the semiconductor substrate,
    wherein the semiconductor layer has side surfaces opposite to the diffusion layers, and each of the side surfaces has said shape.

* * * * *